US012809249B2

(12) United States Patent
Goriki et al.

(10) Patent No.: US 12,809,249 B2
(45) Date of Patent: Nov. 24, 2026

(54) EUV TRANSMISSIVE MEMBRANE, METHOD OF USE THEREOF, AND EXPOSURE METHOD

(71) Applicant: NGK INSULATORS, LTD., Nagoya-City (JP)

(72) Inventors: Naoki Goriki, Kasugai-City (JP); Takashi Tanimura, Handa-City (JP); Toshikatsu Kashiwaya, Inazawa-City (JP); Hiroki Chaen, Yokohama-City (JP)

(73) Assignee: NGK INSULATORS, LTD., Nagoya (JP)

( * ) Notice: Subject to any disclaimer, the term of this patent is extended or adjusted under 35 U.S.C. 154(b) by 544 days.

(21) Appl. No.: 18/483,609

(22) Filed: Oct. 10, 2023

(65) Prior Publication Data

US 2024/0094620 A1 Mar. 21, 2024

Related U.S. Application Data

(63) Continuation of application No. PCT/JP2022/034607, filed on Sep. 15, 2022.

(51) Int. Cl.
*G03F 1/22* (2012.01)

(52) U.S. Cl.
CPC .................................... *G03F 1/22* (2013.01)

(58) Field of Classification Search
CPC ..... G03F 1/22; G03F 1/24; G03F 1/62; G03F 7/70983
USPC .......................................................... 430/5, 1
See application file for complete search history.

(56) References Cited

U.S. PATENT DOCUMENTS

| | | | |
|---|---|---|---|
| 10,228,615 B2 | 3/2019 | Nikipelov et al. | |
| 2017/0205704 A1 | 7/2017 | Nikipelov et al. | |
| 2019/0137864 A1 | 5/2019 | Song et al. | |
| 2020/0192216 A1 | 6/2020 | Yanase | |
| 2022/0197131 A1* | 6/2022 | Kuyel | G03F 1/40 |
| 2022/0269165 A1* | 8/2022 | Janssen | G03F 7/70983 |
| 2025/0278032 A1* | 9/2025 | Kashiwaya | G03F 7/70958 |

FOREIGN PATENT DOCUMENTS

| | | |
|---|---|---|
| EP | 3 330 796 B1 | 5/2022 |
| JP | 2017-522590 A | 8/2017 |
| JP | 2020-098227 A | 6/2020 |
| JP | 6858817 B2 | 4/2021 |
| KR | 10-2020-0076258 A | 6/2020 |

(Continued)

OTHER PUBLICATIONS

Shin (Year: 2022).*

(Continued)

*Primary Examiner* — Caleen O Sullivan
(74) *Attorney, Agent, or Firm* — Muncy, Geissler, Olds & Lowe, P.C.

(57) ABSTRACT

Provided is an EUV transmissive membrane including a main layer having an EUV transmittance of 85% or more at a wavelength of 13.5 nm, wherein the main layer is composed of a monolayer or a composite layer of two or more layers, and a protective layer that covers at least one side of the main layer, wherein the protective layer includes at least one selected from the group consisting of amorphous carbon, Cu, Al, and an organic resist as a main component.

8 Claims, 3 Drawing Sheets

(56) References Cited

FOREIGN PATENT DOCUMENTS

| | | | |
|---|---|---|---|
| KR | 10-2021-0047455 | A | 4/2021 |
| KR | 10-2021-0054385 | A | 5/2021 |
| KR | 10-2022-0017133 | A | 2/2022 |
| KR | 10-2022-0017135 | A | 2/2022 |
| WO | 2021/018777 | A1 | 2/2021 |

OTHER PUBLICATIONS

English translation of Written Opinion of the International Searching Authority (Application No. PCT/JP2022/034607) dated Dec. 6, 2022.
Korean Office Action (with English translation) dated Jan. 6, 2026 (Application No. 10-2023-7014967).
International Search Report and Written Opinion (Application No. PCT/JP2022/034607) dated Dec. 6, 2022 (8 pages).
Extended European Search Report (Application No. 22936051.6) dated May 8, 2025 (10 pages).
English translation of International Search Report (Application No. PCT/JP2022/034607) dated Dec. 6, 2022 (2 pages).

* cited by examiner

EUV TRANSMISSIVE MEMBRANE, METHOD OF USE THEREOF, AND EXPOSURE METHOD

CROSS-REFERENCE TO RELATED APPLICATION

This application is a continuation application of PCT/JP2022/034607 filed Sep. 15, 2022, the entire contents all of which are incorporated herein by reference.

BACKGROUND OF THE INVENTION

1. Field of the Invention

The present invention relates to an EUV transmissive membrane, method of use thereof, and exposure.

2. Description of the Related Art

With miniaturization in semiconductor manufacturing process advancing year by year, various improvements have been made in each step. Particularly, in a photolithography step, extreme ultraviolet (EUV) light having a wavelength of 13.5 nm has begun to be used in place of conventional ArF exposure having a wavelength of 193 nm. As a result, the wavelength was reduced to 1/10 or less at once, and optical properties thereof were completely different. Since there is no material having a high transmittance to EUV light, however, there is still no practical pellicle, which serves as a particle adhesion-preventing membrane of, for example, a photomask (reticle). For this reason, device manufacturers currently cannot use pellicles when manufacturing semiconductor devices.

Therefore, a pellicle membrane has been developed. It is desirable to use Si, Be, Y, Zr, or the like having a high EUV transmittance as a core material of the pellicle membrane. Patent Literature 1 (JP6858817B) discloses a pellicle membrane including a core layer that contains a material substantially transparent for EUV radiation such as (poly-)Si and a cap layer that contains a material absorbing IR radiation.

In addition, Patent Literature 2 (JP2020-98227A) discloses a pellicle membrane stretched on one end face of a pellicle frame, the pellicle membrane having a main layer of single-crystal Si, and graphene on one side or both sides of the main layer. It has been proposed that when the main layer has graphene, the pellicle membrane is not damaged during pellicle fabrication and can exhibit sufficient mechanical strength.

CITATION LIST

Patent Literature

Patent Literature 1: JP6858817B
Patent Literature 2: JP2020-98227A

SUMMARY OF THE INVENTION

The core material having high EUV transmittance used for the pellicle membrane as described above forms a natural oxide membrane of several nm on the surface thereof in air, and the oxide membrane absorbs EUV, resulting in a decrease in EUV transmittance of the pellicle membrane. In particular, Be is a material having high EUV transmittance, but a natural oxide membrane of 2 to 3 nm is considered to be formed on the surface thereof. The transmittance loss due to the oxide membrane is as large as 6 to 9%. In addition, the process of fabricating a pellicle membrane sometimes involves treatment using a gas other than air, such as fluorine or chlorine, an acid, or an alkali solution, which may generate a side reaction membrane on the surface of the core material, thereby decreasing the EUV transmittance. Therefore, it is desirable to form a protective layer on the surface of the core material to suppress the formation of these membranes.

However, while applying a reaction-inhibiting protective layer on the surface of a core material such as Si and Be can prevent a significant decrease in EUV transmittance of the pellicle membrane, such a protective layer also has lower EUV transmittance than the pure core material, leading to a decrease in the EUV transmittance of the pellicle membrane as a whole. For example, Ru may be used as a protection layer for a Be core material. In the case of a pellicle membrane with a three-layer structure (Ru/Be/Ru) in which 1 to 2 nm of Ru is provided on the front and back surfaces of the Be core material, the Ru protective layer causes an EUV transmission loss of about 3 to 6%, which significantly degrades the performance of the pellicle membrane. Other protective layers include nitrides such as $Si_3N_4$ and $Be_3N_2$, but there is a problem of a decrease in EUV transmittance as mentioned above. In other words, there is a demand for an EUV transmissive membrane capable of suppressing or eliminating EUV absorption by a protective layer, which has been a factor in the reduction of EUV transmittance in a conventional pellicle membrane.

The inventors have recently found that by covering a main layer having high EUV transmittance with a temporary protective layer removable by EUV exposure, it is possible to eliminate EUV absorption by the protective layer, which has been a factor in the reduction of EUV transmittance, thereby providing an EUV transmissive membrane capable of exhibiting high EUV transmittance during exposure.

Accordingly, an object of the present invention is to provide an EUV transmissive membrane capable of eliminating EUV absorption by a protective layer, which has been a factor in the reduction of EUV transmittance, thereby exhibiting high EUV transmittance during exposure.

The present invention provides the following aspects:

[Aspect 1] An EUV transmissive membrane comprising:

a main layer having an EUV transmittance of 85% or more at a wavelength of 13.5 nm, wherein the main layer is composed of a monolayer or a composite layer of two or more layers, and a protective layer that covers at least one side of the main layer, wherein the protective layer comprises at least one selected from the group consisting of amorphous carbon, Cu, Al, and an organic resist as a main component.

[Aspect 2] The EUV transmissive membrane according to Aspect 1, wherein both sides of the main layer are covered with the protective layer.

[Aspect 3] The EUV transmissive membrane according to Aspect 1 or 2, wherein the main layer comprises Be, Si, Y, or Zr as a main component.

[Aspect 4] The EUV transmissive membrane according to any one of Aspects 1 to 3, wherein the protective layer has a thickness of 5 nm or less.

[Aspect 5] The EUV transmissive membrane according to any one of Aspects 1 to 4, wherein the protective layer is composed of amorphous carbon.

[Aspect 6] A method of using an EUV transmissive membrane, comprising the steps of:

installing the EUV transmissive membrane according to any one of Aspects 1 to 5 into an EUV exposure apparatus; and irradiating the EUV transmissive membrane with EUV to remove the protective layer.

[Aspect 7] An exposure method, comprising the steps of:

installing the EUV transmissive membrane according to any one of Aspects 1 to 5 into an EUV exposure apparatus;

irradiating the EUV transmissive membrane with EUV, thereby removing the protective layer to expose the main layer; and transmitting EUV through the exposed main layer by EUV irradiation to perform pattern exposure on a photosensitive substrate plate in the EUV exposure apparatus.

DETAILED DESCRIPTION OF THE INVENTION

EUV Transmissive Membrane

Figure 1:
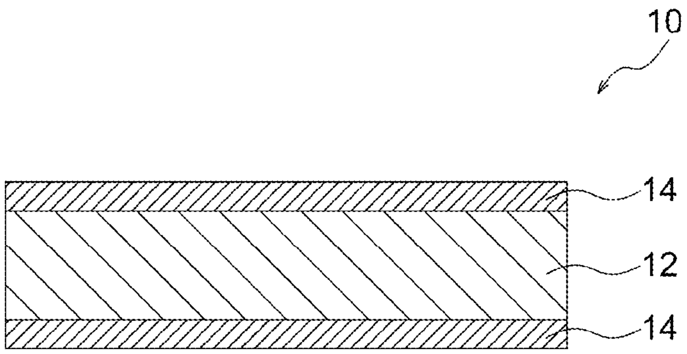
FIG. 1 is a schematic cross-sectional view illustrating an embodiment of an EUV transmissive membrane according to the present invention.

FIG. 1 illustrates a schematic cross-sectional view of an EUV transmissive membrane 10 according to an embodiment of the present invention. The EUV transmissive membrane 10 includes a main layer 12 and a protective layer 14 that covers at least one side of the main layer 12. The main layer 12 has an EUV transmittance of 85% or more at a wavelength of 13.5 nm, which is composed of a monolayer or a composite layer of two or more layers. The protective layer 14 contains at least one selected from the group consisting of amorphous carbon, Cu, Al, and an organic resist as a main component. Thus, by covering the main layer having high EUV transmittance with a temporary protective layer removable by EUV exposure, it is possible to eliminate EUV absorption by the protective layer, which has been a factor in reduction of EUV transmittance, thereby providing an EUV transmissive membrane capable of exhibiting high EUV transmittance during exposure.

As mentioned above, a core material having high EUV transmittance may form a natural oxide membrane of several nm on the surface thereof in air. In addition, the process of fabricating a pellicle membrane sometimes involves treatment using a gas other than air, such as fluorine or chlorine, an acid, or an alkali solution, which may generate a side reaction membrane on the surface of the core material. The formation of such a membrane decreases the EUV transmittance of the pellicle membrane. Therefore, it is desirable to form a protective layer on the surface of the core material to suppress the formation of these membranes. However, applying a reaction-inhibiting protective layer to the surface of the core material leads to a decrease in the EUV transmittance of the pellicle membrane as a whole. All these problems are successfully solved by the EUV transmissive membrane of the present invention. Below is the mechanism by which the EUV transmissive membrane of the present invention can prevent a reduction of EUV transmittance due to the protective layer while preventing the formation of a natural oxide membrane or the like. The EUV transmissive membrane of the present invention includes a main layer having high EUV transmittance and a protective layer that covers at least one side of the main layer, and this protective layer is a temporary protective layer removable by EUV exposure. In other words, the above-described natural oxide membrane or side reaction membrane is formed before the pellicle membrane is fabricated, mounted on the EUV exposure apparatus, and subjected to the exposure process. However, the EUV transmissive membrane of the present invention can prevent the formation of the above-described membrane by having a protective layer. Next, the exposure process is generally performed in a hydrogen atmosphere, in which there are many hydrogen radicals generated by EUV. Therefore, when the protective layer is composed of a material that is removed by hydrogen radicals, the protective layer of the EUV transmissive membrane can be removed in the exposure apparatus to obtain a membrane of only pure core material (main layer), which can exhibit high transmittance as a pellicle membrane. This mechanism allows the EUV transmissive membrane of the present invention to prevent a reduction of EUV transmittance due to the protective layer through the removal of a temporary protective layer during the exposure process while preventing the formation of a natural oxide membrane or the like by the temporary protective layer. As a result, it is possible to exhibit high EUV transmittance during exposure.

The main layer 12 has an EUV transmittance of 85% or more, preferably 92% or more, more preferably 94% or more, and even more preferably 96% or more at a wavelength of 13.5 nm. In the exposure process, the protective layer 14 of the EUV transmissive membrane 10 is removed, and the main layer 12 remains. Therefore, a higher EUV transmittance of the main layer 12 is desirable, and the upper limit thereof is not particularly limited. Although ideally 100%, the main layer 12 typically has a EUV transmittance of 99% or less, and more typically 98% or less. The main layer 12 may be a monolayer or a composite layer of two or more layers. In any case, the main layer 12 preferably contains Be, Si, Y, or Zr as a main component. Here, the "main component" in the main layer 12 means a component that accounts for 50 mol % or more, preferably 70 mol % or more, more preferably 80 mol % or more, and even more preferably 90 mol % or more of the main layer 12. Meanwhile, the main layer 12 (especially, a monolayer or at least one layer constituting a composite layer) may be composed only of Be, Si, Y, or Zr. Such main layer 12 contributes to the realization of high EUV transmittance while ensuring basic functions as a pellicle membrane (such as particle adhesion preventing function). From this viewpoint, the thickness of the main layer 12 is preferably 10 to 70 nm, more preferably 15 to 50 nm, and even more preferably 20 to 35 nm.

As described above, the main layer 12 may be a composite layer of two or more layers. For example, when a protective layer of amorphous carbon is provided directly on the main layer, a metallic beryllium layer, the amorphous carbon and metallic beryllium may react to form beryllium carbide. For example, the main layer 12 is therefore composed of composite layers such as metallic beryllium layer/beryllium nitride layer (or beryllium nitride layer/metallic beryllium layer/beryllium nitride layer) and provided with the protective layer of amorphous carbon on the beryllium nitride layer. Thus, the reaction between amorphous carbon and metallic beryllium can be prevented, that is, the reaction between the main layer and the protective layer can be suppressed. The term "beryllium nitride" as used herein means a comprehensive composition that allows not only a stoichiometric composition such as $Be_3N_2$ but also a non-stoichiometric composition such as $Be_3N_{2-x}$, wherein $0<x<2$.

The protective layer 14 is a layer for temporarily protecting the main layer 12. Accordingly, the protective layer 14 may cover at least one side of the main layer 12, and it is preferable to cover both sides of the main layer 12 with the protective layer. The protective layer 14 contains at least one selected from the group consisting of amorphous carbon, Cu, Al, and an organic resist as a main component. Given the high UV transmittance, the low impact of the residue on the main layer 12 when the protective layer 14 is removed, and the easy removal of the protective layer 14, the protective layer 14 preferably contains amorphous carbon as a main component, and more preferably is composed of amorphous carbon. In general, amorphous carbon does not have a completely disordered atomic arrangement but microscopically has a crystal structure (i.e., it has crystallites). Such crystallites are often arranged in a disordered manner, making them amorphous as a whole. In particular, diamond-like carbon (DLC) refers to a material containing many crystallites with a cubic four-coordinated structure, such as diamond, while graphite-like carbon (GLC) refers to a material containing many crystallites with a planar three-coordinated structure, such as graphite. The protective layer 14 may be carbon with a completely disordered atomic arrangement, carbon having crystallites in a disordered manner, or even amorphous carbon that is not completely dense but rather contains fine pores. Here, the "main component" in the protective layer 14 means a component that accounts for 50% by weight or more, preferably 60% by weight or more, more preferably 70% by weight or more, and even more preferably 80% by weight or more of the total weight of the protective layer 14. Meanwhile, the protective layer 14 may be composed of at least one selected from the group consisting of amorphous carbon, Cu, Al, and an organic resist.

The protective layer 14 preferably has a thickness of 5 nm or less, and more preferably 3 nm or less. The lower limit of the thickness of the protective layer 14 is not particularly limited but is typically 1 nm or more.

As described above, the main layer 12 may be a composite layer of two or more layers, and for example, the main layer 12 may include a nitride layer such as a beryllium nitride layer on one side or both sides thereof, in addition to a metallic layer such as a beryllium layer. In this case, the main layer 12 preferably has a nitrogen concentration gradient region where nitrogen concentration decreases as closer to the metallic layer such as the beryllium layer. In other words, when the composition of beryllium nitride may include from the stoichiometric composition such as $Be_3N_2$ to the non-stoichiometric composition such as $Be_3N_{2-x}$, wherein $0<x<2$, as described above, the beryllium nitride constituting the beryllium nitride layer preferably has a gradient composition that is richer in beryllium as closer to the beryllium layer. As a result, it is possible to improve the adhesion between the nitride layer constituting the main layer 12 (i.e., beryllium nitride layer) and the metallic layer (i.e., beryllium layer) and relieve stress caused by the difference in thermal expansion between the two layers. That is, it is possible to improve the adhesion between the two layers to suppress delamination, and to make delamination difficult as a thermal expansion relaxation layer between the two layers in the case of absorbing EUV light and becoming a high temperature. The thickness of the nitrogen concentration gradient region is preferably smaller than that of the nitride layer. In other words, the entire thickness of the nitride layer does not need to be in the nitrogen concentration gradient region. For example, it is preferable that only a part of the thickness of the nitride layer, for example, a region of preferably 10 to 70% and more preferably 15 to 50% of the thickness of the nitride layer is the nitrogen concentration gradient region.

In the EUV transmissive membrane 10, the main region for transmitting EUV is preferably in a form of the free-standing membrane. In other words, it is preferable that the substrate (e.g., Si substrate) used at the time of deposition remains as a border only at the outer edge of the EUV transmissive membrane 10, that is, no substrate (e.g., Si substrate) remains in the main region other than the outer edge. In short, the main region preferably consists of the main layer 12 and the protective layer 14. It is preferable that the protective layer 14 is completely removed in the exposure process. Since the inside of the exposure apparatus is usually decompressed to an ultrahigh vacuum before starting the process, the oxygen partial pressure inside the exposure apparatus is extremely low, and the main layer 12 exposed by removing the protective layer 14 is hardly oxidized. The main layer 12 surface may be slightly oxidized by a small amount of residual oxygen in the exposure apparatus, but the oxidized portion can be reduced by EUV irradiation in a hydrogen atmosphere. Therefore, the EUV transmissive membrane 10 subjected to the exposure process can maintain high EUV transmittance until it is taken out from the exposure apparatus.

Manufacturing Method

After a laminated membrane to be an EUV transmissive membrane is formed on a Si substrate, the EUV transmissive membrane according to the present invention can be fabricated by removing an unnecessary portion of the Si substrate through etching to form a free-standing membrane. Accordingly, the main portion of the EUV transmissive membrane is in the form of the free-standing membrane in which no Si substrate remains as described above.

(1) Preparation of Si Substrate

First, a Si substrate for forming a laminated membrane thereon is prepared. After the laminated membrane composed of the main layer 12 and the protective layer 14 is formed on the Si substrate, the main region (i.e., a region to be a free-standing membrane) other than the outer edge of the Si substrate is removed by etching. Accordingly, it is desirable to reduce the thickness of the Si substrate in the region to be formed into the free-standing membrane in advance in order to perform the etching efficiently in a short time. Therefore, it is desirable that a mask corresponding to the EUV transmission shape is formed on the Si substrate by employing a normal semiconductor process, and the Si substrate is etched by wet etching to reduce the thickness of the main region of the Si substrate to a predetermined thickness. The wet-etched Si substrate is cleaned and dried to prepare a Si substrate having a cavity formed by wet etching. The wet etching mask may be made of any material that is corrosion resistance to Si wet etchant, for example, $SiO_2$ is suitable for use. In addition, the wet etchant is not particularly limited as long as it is capable of etching Si. For example, TMAH (tetramethylammonium hydroxide) is preferred because it can be used under appropriate conditions, and very good anisotropic etching can be performed on Si.

(2) Formation of Laminated Membrane

The laminated membrane may be formed by any deposition method. An example of the preferred deposition method is the sputtering method. In the case of fabricating a three-layer structure of amorphous carbon/beryllium/amorphous carbon, it is preferable that the beryllium membrane as the main layer 12 is fabricated by sputtering using a pure Be target and the amorphous carbon membrane as the protective layer 14 is done by reactive sputtering using a graphite target. The methods of forming the beryllium or amorphous carbon membrane are not limited to thereto. The beryllium and amorphous carbon membranes may be formed in a one-chamber sputtering apparatus as in Examples described later, or a two-chamber sputtering apparatus may be used to form the beryllium and amorphous carbon membranes in separate chambers.

In the case of fabricating the main layer 12 as a composite layer with a three-layer structure of beryllium nitride/beryllium/beryllium nitride, it is preferable that the beryllium membrane is fabricated by sputtering using a pure Be target and the beryllium nitride membrane is done by reactive sputtering. The reactive sputtering can be performed, for example, by adding nitrogen gas to the chamber during sputtering using a pure Be target, whereby beryllium and nitrogen react to each other to generate beryllium nitride. As another method, beryllium nitride can be produced by forming a beryllium membrane and then irradiating the membrane with nitrogen plasma to cause a nitriding reaction of beryllium, thereby generating beryllium nitride. In any case, synthetic methods for beryllium nitride are not limited thereto.

In the case of forming a nitrogen concentration gradient region in the composite layer with a three-layer structure of beryllium nitride/beryllium/beryllium nitride, when depositing the beryllium nitride membrane and metallic beryllium, the introduction of nitrogen gas may be stopped and switched to metallic beryllium deposition while continuing a sputtering using a pure Be target with nitrogen gas in the chamber. In this way, a region is formed in which the nitrogen concentration in the film-deposited membrane decreases in the thickness direction as the concentration of nitrogen gas in the chamber decreases. On the other hand, in the case of switching the metallic beryllium to the beryllium nitride, the nitrogen concentration gradient region can be formed by starting the introduction of nitrogen gas in the middle of the process while sputtering is performed, contrary to the above. The thickness of the nitrogen concentration gradient region can be controlled by adjusting the time for which the nitrogen gas concentration is changed.

(3) Free-standing Membrane Formation

An unnecessary portion of the Si substrate other than the outer edge of the Si substrate where the composite membrane is formed, which is left as a border, is removed by etching to make the composite membrane free-standing. Etching of Si may be performed by any method, but etching with $XeF_2$ is preferred.

Method of Use and Exposure

As described above, the exposure process is generally performed in a hydrogen atmosphere, in which there are many hydrogen radicals generated by EUV. Therefore, the protective layer 14 in the EUV transmissive membrane 10 is removed by the hydrogen radicals to obtain a membrane of only pure core material (main layer 12), so that the main layer 12 can exhibit high transmittance as a pellicle membrane in the exposure process. Accordingly, a preferred method of using an EUV transmissive membrane includes the steps of: installing the EUV transmissive membrane into an EUV exposure apparatus; and irradiating the EUV transmissive membrane with EUV to remove the protective layer. In addition, a preferred exposure method includes the steps of: installing the EUV transmissive membrane into an EUV exposure apparatus; irradiating the EUV transmissive membrane with EUV, thereby removing the protective layer to expose the main layer; and transmitting EUV through the exposed main layer by EUV irradiation to perform pattern exposure on a photosensitive substrate plate in the EUV exposure apparatus.

EXAMPLES

The present invention will be described in more detail with reference to the following examples.

Example 1

According to the procedures illustrated in FIGS. 2A and 2B, a composite free-standing membrane (EUV transmissive membrane) with a three-layer structure of amorphous carbon/beryllium/amorphous carbon was fabricated as follows.

(1) Preparation of Si Substrate

Figure 2A:
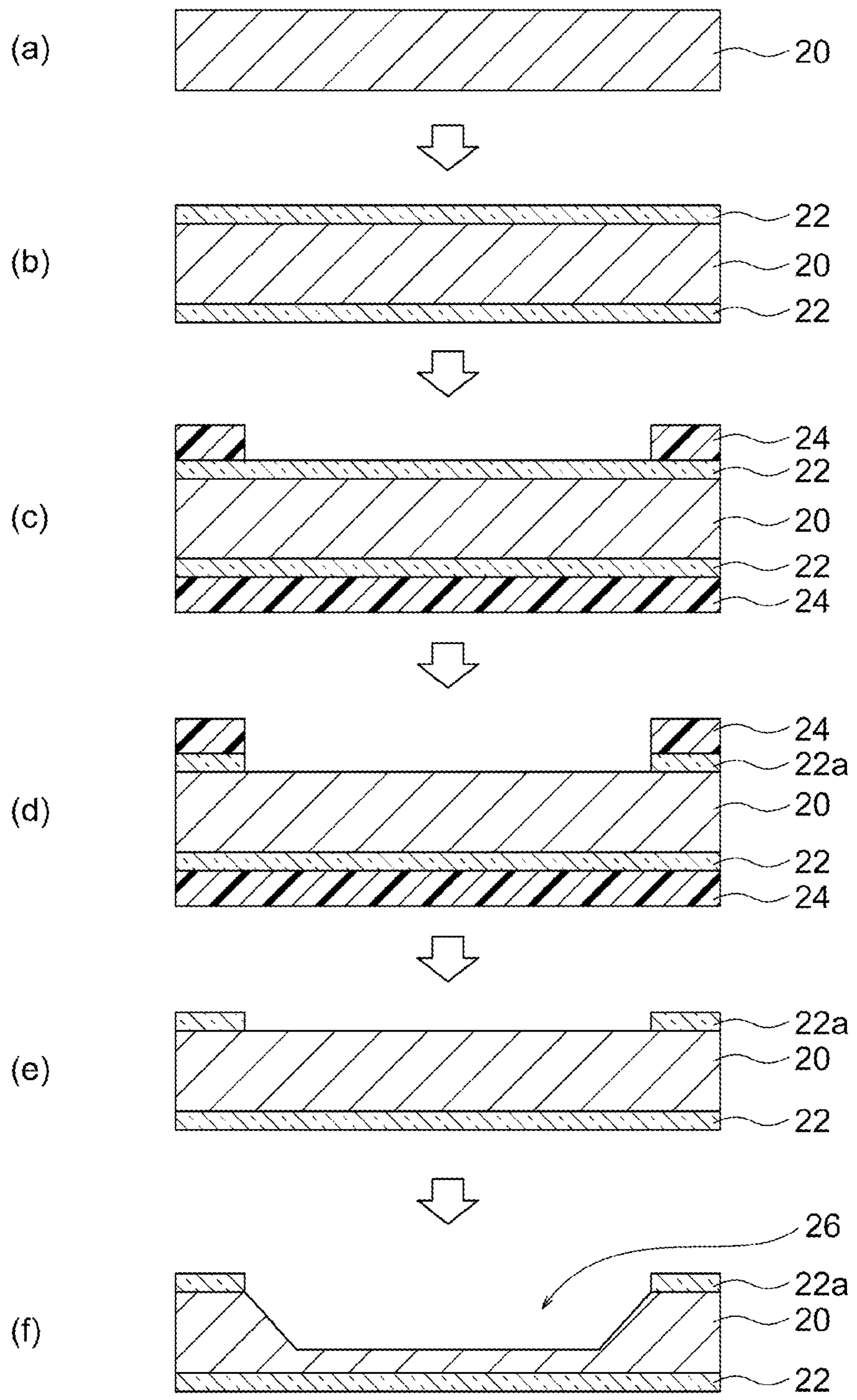
FIG. 2A is a process flow diagram illustrating the first half of a manufacturing procedure for an EUV transmissive membrane in Examples 1 to 3.
Figure 2B:
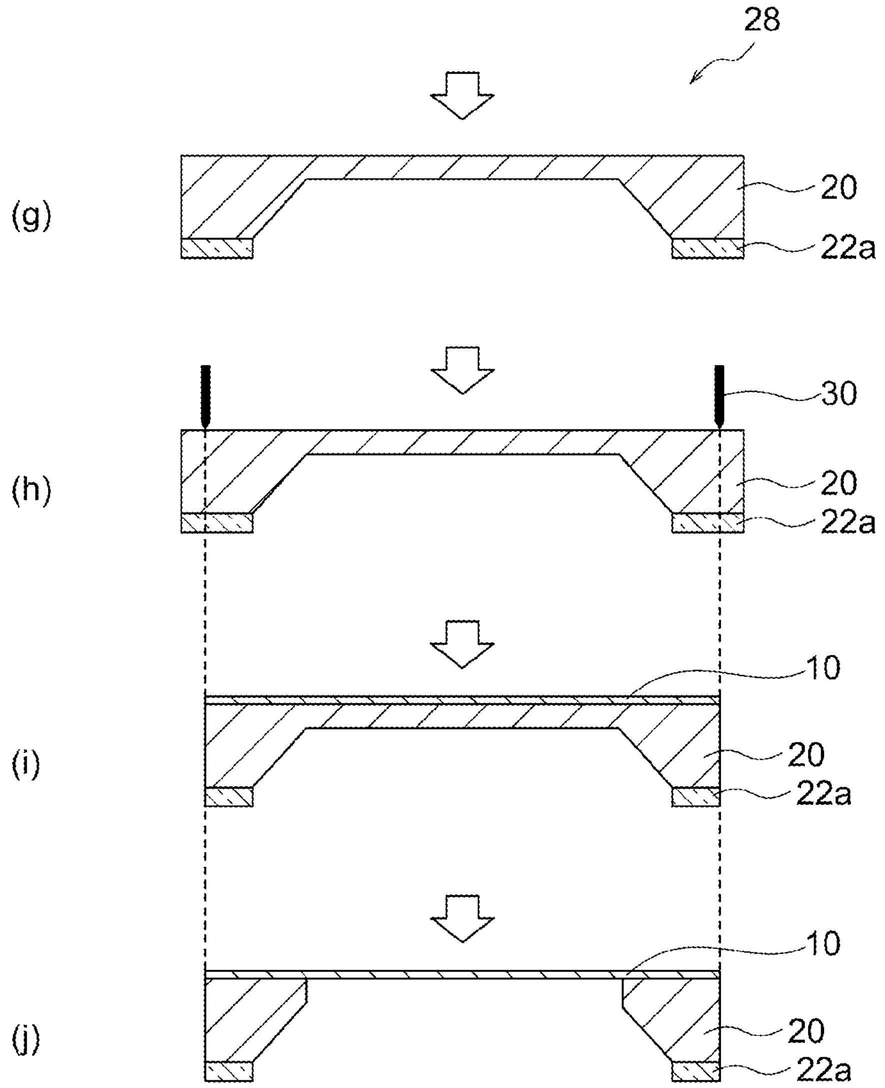
FIG. 2B is a process flow diagram illustrating the second half of a manufacturing procedure for an EUV transmissive membrane in Examples 1 to 3.

A Si wafer 20 having a diameter of 8 inches (20.32 cm) was prepared (FIG. 2A (a)). A $SiO_2$ membrane 22 having a thickness of 50 nm was formed on both sides of the Si wafer 20 by thermal oxidation (FIG. 2A (b)). Resist was applied to both sides of the Si wafer 20, and a resist mask 24 for $SiO_2$ etching was formed by exposure and development so that a 110 mm×145 mm resist hole was created on one side (FIG. 2A(c)). An exposed portion of the $SiO_2$ membrane 22 was etched and removed by wet-etching one side of the substrate with hydrofluoric acid to fabricate a $SiO_2$ mask 22*a* (FIG. 2A(d)). The resist mask 24 for $SiO_2$ etching was removed with an ashing apparatus (FIG. 2A(e)). Si was then wet-etched with a TMAH solution. This etching was performed only for an etching time to obtain a target Si substrate having thickness of 50 μm with an etching rate measured in advance (FIG. 2A(f)). Finally, the $SiO_2$ membrane 22 formed on the surface not subjected to Si etching was removed and cleaned with hydrofluoric acid to prepare a Si substrate 28 (FIG. 2B(g)). The Si substrate outline may be diced with a laser 30, if necessary (FIG. 2B (h)), to achieve the desired shape (FIG. 2B (i)). In this way, a 110 mm×145 mm cavity 26 was provided at the center of the 8-inch (20.32 cm) Si wafer 20 to prepare the Si substrate 28 having a Si thickness of 50 μm in the cavity 26 portion.

(2) Formation of Composite Membrane

On the Si substrate 28 including the cavity 26 obtained in (1) above, a composite membrane with a three-layer structure of amorphous carbon/beryllium/amorphous carbon was formed as follows (FIG. 2B(i)). First, the Si substrate plate 28 was set in a multi-target sputtering apparatus, and a graphite target and a pure Be target were attached thereto. A chamber was evacuated, the graphite target was used to carry out sputtering only with argon gas at an internal pressure of 0.3 Pa, and the sputtering was terminated at the time when 2 nm of diamond-like carbon (DLC) was layer-deposited as amorphous carbon. Subsequently, the chamber was evacuated again, the pure Be target was used to carry out sputtering only with argon gas at an internal pressure of 0.5 Pa, and the sputtering was terminated at the time when 30 nm of beryllium was layer-deposited. Thereafter, sputtering was performed using the graphite target in the same manner as in the first step, and the sputtering was terminated at the time when 2 nm of amorphous carbon was layer-deposited. In this manner, a composite membrane with 2 nm of amorphous carbon (C)/30 nm of beryllium (Be)/2 nm of amorphous carbon (C) was formed as the EUV transmissive membrane 10. In other words, the EUV transmissive membrane 10 includes a main layer containing Be as a main component and a protective layer containing amorphous carbon as a main component on both sides of the main layer.

(3) Free-standing Membrane Formation

The Si substrate 28 with the composite membrane prepared in (2) above was set in a chamber of an $XeF_2$ etcher capable of processing an 8-inch (20.32 cm) substrate. The chamber was sufficiently evacuated. At this time, if moisture remains in the chamber, the moisture reacts with the $XeF_2$ gas to generate hydrofluoric acid, and corrosion of the etcher or unexpected etching occurs. Therefore, the sufficient evacuation was performed. If necessary, vacuuming and nitrogen gas introduction were repeated in the chamber to reduce residual moisture in the chamber. When the sufficient evacuation was achieved, a valve between a $XeF_2$ material tank and a preliminary space was opened. As a result, $XeF_2$ was sublimated, and $XeF_2$ gas was also accumulated in the preliminary space. When the $XeF_2$ gas was sufficiently accumulated in the preliminary space, the valve between the preliminary space and the chamber was opened to introduce the $XeF_2$ gas into the chamber. The $XeF_2$ gas was decomposed into Xe and F, and F reacted with Si to generate $SiF_4$. Since the boiling point of $SiF_4$ was −95° C., $SiF_4$ generated was rapidly evaporated, causing a reaction of F with the newly exposed Si substrate. When the Si etching proceeded and F in the chamber decreased, the chamber was evacuated, and the $XeF_2$ gas was introduced into the chamber again to perform the etching. In this manner, the evacuation, the introduction of the $XeF_2$ gas, and the etching were repeated, and the etching was continued until the Si substrate 28 corresponding to the portion to be formed into the free-standing membrane disappeared. When the Si substrate of the unnecessary portion disappeared, the etching was terminated. In this way, a composite free-standing membrane having a border 20 made of Si is obtained as the EUV transmissive membrane 10 (FIG. 2B(j)).

Example 2 (Comparison)

A composite free-standing membrane with a three-layer structure of ruthenium/beryllium/ruthenium was fabricated in the same manner as in Example 1, except that the composite membrane was formed as follows.

(Formation of Composite Membrane)

The cavity-formed Si substrate plate obtained in (1) of Example 1 was placed in a multi-target sputtering apparatus, and a pure ruthenium target and a pure Be target were attached thereto. A chamber was evacuated, the pure ruthenium target was used to carry out sputtering only with argon gas at an internal pressure of 0.3 Pa, and the sputtering was terminated at the time when 2 nm of ruthenium was layer-deposited. Subsequently, the chamber was evacuated again, the pure Be target was used to carry out sputtering only with argon gas at an internal pressure of 0.5 Pa, and the sputtering was terminated at the time when 30 nm of beryllium was layer-deposited. Thereafter, sputtering was performed using the pure ruthenium target in the same manner as in the first step, and the sputtering was terminated at the time when 2 nm of ruthenium was layer-deposited. In this manner, a composite membrane with 2 nm of ruthenium (Ru)/30 nm of beryllium (Be)/2 nm of ruthenium (Ru) was formed as the EUV transmissive membrane.

Example 3 (Comparison)

A composite free-standing membrane with a three-layer structure of crystalline carbon/beryllium/crystalline carbon was fabricated in the same manner as in Example 1, except that the composite membrane was formed as follows.

(Formation of Composite Membrane)

The cavity-formed Si substrate plate obtained in (1) of Example 1 was placed in a chemical vaper deposition (CVD) apparatus to deposit 2 nm of crystalline carbon with a crystal structure of graphite using methane as a gas material. Subsequently, the Si substrate plate with crystalline carbon deposited was set in a multi-target sputtering apparatus, and a graphite target and a pure Be target were attached thereto. A chamber was evacuated, the pure Be target was used to carry out sputtering only with argon gas at an internal pressure of 0.5 Pa, and the sputtering was terminated at the time when 30 nm of beryllium was layer-deposited. The graphite target was used to carry out sputtering only with argon gas at an internal pressure of 0.3 Pa, and the sputtering was terminated at the time when 0.5 nm of amorphous carbon was layer-deposited. Thereafter, the sputtered Si substrate plate was placed in a CVD apparatus again, hydrogen cleaning was performed until amorphous carbon was sufficiently removed, and 2 nm of crystalline carbon with a crystal structure of graphite was deposited using methane as a gas material in the same manner as in the first step. In this manner, a composite membrane with 2 nm of crystalline carbon (C)/30 nm of beryllium (Be)/2 nm of crystalline carbon (C) was formed as the EUV transmissive membrane. The amorphous carbon temporarily deposited by sputtering is formed to suppress the oxidation of beryllium during the period from sputtering to chemical vapor deposition.

EUV Transmittance

EUV light was irradiated onto a free-standing membrane as the EUV transmissive membrane fabricated in Examples 1 to 3 at a power of 600 W in a hydrogen atmosphere of 20 Pa for 15 minutes, and then the amount of transmitted EUV light was measured with a sensor. The EUV transmittance was determined by comparing the obtained measurement value with a value obtained by directly measuring the amount of EUV light with a sensor without using the EUV transmissive membrane. As a result, the EUV transmittance of the composite free-standing membrane fabricated in Example 1 was 95%. The EUV transmittance of the composite free-standing membrane fabricated in Example 2 as a comparative example was 88%. The EUV transmittance of the composite free-standing membrane fabricated in Example 3 as a comparative example was 90%. When the composite free-standing membrane in Example 3 was analyzed, it was confirmed that crystalline carbon remained in the protective layer. In other words, in the composite free-standing membrane of crystalline carbon/beryllium/crystalline carbon of Example 3, it is considered that the crystalline carbon is hardly removed in the exposure process and remains on the surface of the main layer of beryllium, which decreases the EUV transmittance of the composite free-standing membrane. On the other hand, in the composite free-standing membrane of amorphous carbon/beryllium/amorphous carbon of Example 1 is considered to exhibit a high EUV transmittance of 95% because the amorphous carbon is removed in the exposure process, leaving only the main layer of beryllium.

What is claimed is:

1. An EUV transmissive membrane comprising:

a main layer having an EUV transmittance of 85% or more at a wavelength of 13.5 nm, wherein the main layer is composed of a monolayer or a composite layer of two or more layers, and a protective layer that covers at least one side of the main layer, wherein the protective layer comprises at least one selected from the group consisting of diamond-like carbon and an organic resist as a main component.

2. The EUV transmissive membrane according to claim 1, wherein both sides of the main layer are covered with the protective layer.

3. The EUV transmissive membrane according to claim 1, wherein the main layer comprises Be, Si, Y, or Zr as a main component.

4. The EUV transmissive membrane according to claim 1, wherein the protective layer has a thickness of 5 nm or less.

5. The EUV transmissive membrane according to claim 1, wherein the protective layer is composed of diamond-like carbon.

6. A method of using an EUV transmissive membrane, comprising:

installing the EUV transmissive membrane according to claim 1 into an EUV exposure apparatus; and irradiating the EUV transmissive membrane with EUV to remove the protective layer.

7. An exposure method, comprising:

installing the EUV transmissive membrane according to claim 1 into an EUV exposure apparatus;

irradiating the EUV transmissive membrane with EUV, thereby removing the protective layer to expose the main layer; and transmitting EUV through the exposed main layer by EUV irradiation to perform pattern exposure on a photosensitive substrate plate in the EUV exposure apparatus.

8. A method of using an EUV transmissive membrane, comprising the step of irradiating the EUV transmissive membrane according to claim 1 with EUV to remove the protective layer.

* * * * *